(12) United States Patent
Armbruster

(10) Patent No.: US 6,715,136 B2
(45) Date of Patent: Mar. 30, 2004

(54) METHOD FOR SIMULATING AN ELECTRICAL CIRCUIT, COMPUTER PROGRAM PRODUCT, SOFTWARE APPLICATION, AND DATA CARRIER

(75) Inventor: Hans Ulrich Armbruster, Deisenhofen (DE)

(73) Assignee: Infineon Technologies AG, Munich (DE)

( * ) Notice: Subject to any disclaimer, the term of this patent is extended or adjusted under 35 U.S.C. 154(b) by 201 days.

(21) Appl. No.: 10/075,582

(22) Filed: Feb. 14, 2002

(65) Prior Publication Data

US 2003/0154457 A1 Aug. 14, 2003

(51) Int. Cl.[7] .............................. G06F 9/45; G06F 17/50
(52) U.S. Cl. .............................................. 716/5; 703/14
(58) Field of Search ................................ 716/1, 2, 4, 5, 716/6, 10, 11; 703/13, 14, 19

(56) References Cited

U.S. PATENT DOCUMENTS 5,761,076 A * 6/1998 Miki ............................ 716/5
6,061,508 A * 5/2000 Mehrotra et al. ............. 716/6
2002/0124230 A1 * 9/2002 Cai et al. ..................... 716/6

OTHER PUBLICATIONS

Steven M. Rubin: "Chapter 1: the Characteristics of Digital Electronic Design", *Computer Aids for VLSI Design*, 1994, www.rulabinsky.com/cavd/index.html.

* cited by examiner

Primary Examiner—Leigh M. Garbowski
(74) Attorney, Agent, or Firm—Laurence A. Greenberg; Werner H. Stemer; Ralph E. Locher

(57) ABSTRACT

An electrical circuit can be described by a layout and by a network list. A network list has one or more cells each having one or more cell entities. From an existing layout, intrinsic capacitance values and coupling capacitance values of the networks are determined for all of the cell entities. Using these capacitance values, the cell entities are classified into variants. These variants are used in the simulation of the behavior of the electrical circuit.

11 Claims, 3 Drawing Sheets

METHOD FOR SIMULATING AN ELECTRICAL CIRCUIT, COMPUTER PROGRAM PRODUCT, SOFTWARE APPLICATION, AND DATA CARRIER

BACKGROUND OF THE INVENTION

Field of the Invention

The invention relates to a method for the simulation of an electrical circuit, which can be described by a layout.

The behavior of integrated electrical circuits is often influenced by parasitic effects that are caused by lines.

Undesired capacitive effects are of particular importance in this context that are caused by electrical conductors which run in direct proximity or are arranged next to one another. Electrical conductors can be described by capacitances and by nonreactive resistances. Such capacitive effects caused by conductors are therefore also referred to as parasitic capacitances.

Parasitic capacitances cannot be disregarded in various analyses of integrated electrical circuits, for example when determining the delay or crosstalk. Electrical circuits of great complexity can become unusable due to undesired effects caused by such parasitic capacitances. On account of the large dimension of the network list—generated by an extraction—with parasitic elements, taking account of parasitic capacitances in the simulation of electrical circuits leads to performance problems both in the extraction and in the subsequent analysis steps.

The extraction is often performed in a planar manner. Although the resulting network list comprises all the relevant information, the performance of the extraction and of the subsequent analysis steps on the basis of such a network list proves to be unsatisfactory on account of the very large volumes of data to be handled.

One alternative to this is a hierarchical procedure, in which all the instances of a given cell are entered identically into the network list. It is thereby disadvantageous that the different environments of cell entities are not taken into account and, as a result, an accurate simulation of the electrical circuit is not possible.

A further possibility consists in outputting each entity of a cell as a dedicated variant. With this procedure, it is disadvantageous that the resulting network list contains a very large number of cells and is correspondingly unwieldy in its further processing. Performance problems arise here as well.

A solution approach according to which cells are classified in accordance with their environment is not known in the prior art.

SUMMARY OF THE INVENTION

It is accordingly an object of the invention to provide a method of simulating an electrical circuit that can be described by its layout, and to provide corresponding computer is software as well as nd data carriers, which overcomes the above-mentioned disadvantages of the heretofore-known devices and methods of this general type and which enables an advantageous simulation of electrical circuits, and takes into account effects caused by parasitic capacitances.

With the foregoing and other objects in view there is provided, in accordance with the invention, a method of simulating an electrical circuit that can be described by a layout with a multiplicity of cells. The layout has the following features:

the cells have one or more networks described by geometrical data and subdivided into one or more models of electrical circuit elements;

the cells have information about those layers on which the networks are present; and the cells have references to further cells.

The method comprises the following steps:

a) extracting node information from a layout;

b) determining and recording coupling capacitance values of the networks with isolated consideration of the cells;

c) determining and recording environment-dependent coupling capacitance values of the networks for all of the cell entities;

d) determining and recording intrinsic capacitance values of the networks for each cell;

e) determining and recording intrinsic capacitance values of the networks for all of the cell entities;

f) calculating a respective comparison capacitance value for each network with isolated consideration of the cells;

g) calculating differential capacitance values of each network with respect to a respective comparison capacitance value for all of the cell entities;

h) classifying the cell entities of each cell into different variants for all of the networks by using the differential capacitance values as a basis; and i) simulating a behavior of the electrical circuit using the variants of the cell entities determined in the preceding step.

In accordance with an added feature of the invention, the above step h) is replaced with the following:

h1) defining a tolerance value T and a value for an index k;

h2) selecting a cell from the layout;

h3) selecting a network of the cell selected in step h2);

h4) selecting a k-th cell entity of the cell;

h5) determining the differential capacitance value $D_k$ for the k-th cell entity from a difference in a sum of the intrinsic and lateral capacitance values for the network selected in step h3) and from a sum of the intrinsic and lateral capacitance values of the network in the k-th cell entity;

h6) testing whether a variant V exists for which $|D_k - D_v| \leq T$ and, if the variant V exists, continuing with step h8), otherwise continuing with step h7);

h7) forming a new variant V with $D_v = D_k$;

h8) classifying the k-th cell entity of the cell into the variant V;

h9) incrementing the index k;

h10) testing whether a k-th cell entity of the cell exists and, if a k-th entity exists, continuing with step h4), otherwise:

h11) testing whether a further network exists in the cell under consideration, if the further network exists, selecting the network, defining a value for the index k, and continuing with step h4).

In this case, the intention is to utilize the hierarchy existing in the layout and to take account of the different environments of various entities of identical cells in the resulting network list.

According to the invention, an electrical circuit can be described by a layout and, after the extraction, by a network list.

The layout contains a geometrical description of all the circuit elements arranged on the electrical circuit. This geometrical description is designed in particular in the form of polygons or rectangles.

In accordance with another feature of the invention, steps h2) to h11) are repeated for further cells of the network list.

In accordance with an additional feature of the invention, the above steps h6), h7), and h8) are replaced with the following, starting with a second network under consideration, h6') testing whether a variant V exists for which $|D_k - D_v| \leq T$ and, if the variant does not exist, continuing with step h7');

h6") testing whether the k-th cell entity and the cell entities already contained in the variant V have previously been classified in different variants V and, if not, continuing with step h8');

h7') forming a new variant V with $D_v = D_k$; and h8') classifying the k-th cell entity of the cell into the variant V.

In accordance with a further feature of the invention, coupling capacitances and intrinsic capacitances are extracted in one step as opposed to extracting separately.

In a preferred embodiment of the invention, there are extracted only coupling capacitances or only intrinsic capacitances.

In this case, the layout is subdivided into a multiplicity of cells which each have one or more networks, which are described by geometrical data and contain one or more models of electrical circuit elements. By way of example, a simple cell may contain all those polygons which together represent an inverter. Furthermore, the cells contain information about those layers of the electrical circuit on which the networks or the circuit elements are present. In this case, each polygon is assigned that layer on which the corresponding network or the corresponding electrical circuit element is modeled on the electrical circuit. Furthermore, many cells have references to further cells. In this case, it is possible to insert or instantiate cells into other cells. By way of example, one cell can be inserted as often as desired into other cells. The networks of instantiated cells are identical in all instantiations but often have different environments. This affects the parasitic elements of the networks of the cell, in particular the parasitic capacitances.

Network is the term used to denote the conductive connection between different structural parts, for example between a transistor output and a transistor input. The connections of a capacitance are present as precisely two networks. Electrical information can be transmitted from one network to a further network via a capacitance. Therefore, it is also the that a capacitance connects two networks.

Capacitances can be subdivided into lateral and intrinsic capacitances. The connection to such capacitances constitutes a property of the respective network. In more general form, lateral capacitances can also be designated as coupling capacitances. Coupling capacitances exist between two signal networks, while the intrinsic capacitance exists between a signal network and ground. The method according to the invention can be used for any desired couplings.

In the geometrical sense, i.e. in the layout, the set of all polygons whose processing in the fabrication of an integrated circuit forms a conductive connection between two structural parts corresponds to a network. The polygons belonging to a network are always at the same electrical potential—disregarding propagation time delays of electrical signals. A network can generally be found in the layout only after an extraction, since polygons of different layers can contribute to the network.

According to the invention, a network list is also used for the simulation of an electrical circuit. By means of an extraction, an electrical description is created from the existing layout, the format of which description is designated as network list and the information content of which description corresponds to that of a circuit diagram.

Extraction is understood to be that method in which node information or network names are assigned to the polygons. This involves analysis of which of the polygons are conductively connected after the fabrication process. These polygons are assigned the same node, i.e. these polygons acquire the same network name.

Examples of known network list formats are SPICE or DSPF. If, during the extraction, not only the desired structural parts such as, for example, transistors are included in the network list, but the parasitic, undesirable properties of the lines are also described electrically, then the term "parasitics extraction" is employed. In this case, the lines are usually described by nonreactive resistances and by capacitances. The parasitics extraction generates a network list from an existing layout. The simulation of this network list then corresponds to the behavior of the electrical circuit produced in reality later.

The network list comprises information about the cells contained in it and about their electrical connections. Furthermore, the network list may in each case have one or more entities of cells. The capacitances present in the network list after the parasitics extraction can be subdivided into coupling capacitances with respect to other networks and into intrinsic capacitances with respect to ground. The network list no longer contains information about the polygons but rather only information about the electrical connections. Such a network list can be generated from the extracted layout.

The application of variant classification in accordance with the invention does not require a network list. A network list is generated at a later point in time, to be precise when the exact extraction of all the parasitic elements has been done on the basis of the variant classification of the method according to the invention. A network list containing said variants as cells is then generated. In this case, the network list can be generated by the use of suitable software, in particular the commercial software Assura from Cadence. The circuit simulation of the resulting hierarchical network list can be effected by using software, in particular the software product HSIM from Nassda Corporation.

The method according to the invention is not based on a network list but rather directly on an extracted layout. The extracted layout contains the geometrical information and also the information about the network association. The method is based on these two items of information. Basing the method according to the invention on a network list is conceivable when the network list already contains all of the information about cell- and entity-dependent capacitances.

Firstly, the capacitance values are determined and recorded for the couplings with an isolated consideration of the cells. The environment-dependent capacitance values of the couplings are then determined individually and recorded for all of the cell entities. The intrinsic capacitance values are subsequently determined and recorded separately for each cell. Afterward, the intrinsic capacitances of the networks are determined and recorded for all of the cell entities of the cells.

In the next method step, a respective comparison capacitance value is calculated for each network with isolated consideration of the cells. This comparison capacitance value results from the sum of the capacitance values of the coupling capacitances and intrinsic capacitances contained in the cell considered. Neither the environment of the cells considered nor possible "overrides" are taken into account in this case. "Overrides" are understood as polygons which act on networks in deeper cells and alter their geometry.

In a next method step, the differential capacitance values of each network with respect to the comparison capacitance value determined in the previous step are calculated for all of the cell entities. The environment-dependent coupling capacitance values and "overrides" present on other planes are taken into account in this case. The respective differential capacitance value in this case results from the difference in the capacitance value for the respective cell entity, which takes account of the environment-dependent capacitance values of the networks and/or the "overrides" present on other planes, and from the comparison capacitance value determined in the previous step.

In the next step, the cell entities of each cell are classified into different variants for all of the networks. This is based on the differential capacitance values determined in the previous step. Cell entities classified into identical variants in each case have similar environment-dependent, capacitive properties.

In the concluding method step according to the invention, the behavior of the electrical circuit is simulated using the variants thus determined, in which the cell entities are classified.

The extraction and the simulation of an electrical circuit are very time-consuming precisely in the case of complex circuits, particularly if each cell entity is extracted individually without accessing results that have already been determined and can be transmitted. Hierarchical network lists, which contain not only electrical circuit elements and their connecting lines but also calls or instantiations of further cells whose behavioral description is likewise present as a network list, are suitable for accelerating extractions and simulations. Such cells are extracted and simulated separately. The data, once calculated in the context of the extraction, can be accessed as often as desired without calculating them anew.

The parasitics extraction can be accelerated if multiply instantiated cells are extracted only once. In the parasitics extraction, however, the problem arises that each cell entity has its individual environment and, therefore, formally identical cell entities differ in their capacitive properties in an environment-dependent manner. In the case of the known procedure of parasitics extraction, all the cell entities of a cell are taken into account by a single definition in the network list. This leads, of course, to losses in the accuracy of the extraction and the simulation.

In order to ensure one hundred percent accuracy in the extraction and also in the simulation, every cell entity must be extracted in a manner dependent on its individual environment. This leads to unacceptable run times during the extraction and during the simulation. In this case, the volume of data corresponds to that of a planar extraction. A one-bit cell of a 256 MB DRAM chip leads to an output of 256 million cell entities in the corresponding network list. However, most of these cell entities are identical in their electrical and capacitive properties.

A basic concept of the invention consists in classifying all of the cell entities which occur in a network list into variants on the basis of their capacitive properties governed by their respectively different environment, the cell entities contained in the same variant in each case having similar capacitive properties and the number of variants being kept manageable. In this case, each cell variant covers the behavior of as many cell entities as possible. Geometrically, this corresponds to the assumption of identical environments of these cell entities.

The cell variants to be generated differ in their parasitic elements. In order to utilize the advantages of a hierarchical extraction and simulation, the number of different cell variants is kept manageable. According to the invention, the cell entities are already assigned to a respective variant before the actual performance of the parasitics extraction. This is referred to as "upfront variant identification". The method according to the invention furthermore solves the problem that the actual parasitics are still not known at all at this point in time, a separate consideration of each individual entity beforehand being avoided.

During the extraction—according to the invention—of the parasitic capacitances on the basis of the variant classification, a network list is generated whose size remains manageable. Such a network list can be analyzed very efficiently using hierarchical analysis methods. After the cell entities have been classified, every entity of a cell is not considered individually by means of the parasitics extraction, rather the generated variants of the cell entities are accessed. As a result, the performance of the extraction is considerably increased.

The data structure which is generated by the variant formation according to the invention is constructed fully hierarchically, the cell entities being classified on the basis of the network classification. The electrical properties of the parasitic capacitances are advantageously used, rather than a geometrical quantity, for the cell variant classification according to the invention.

According to one embodiment of the invention, the invention's step of classifying the cell entities of each cell into different variants for all of the networks by using the differential capacitance values as a basis is performed as follows.

In general, the tolerated deviation can be specified in absolute terms in femtofarads or in relative terms in percent. The exemplary embodiment uses exclusively the absolute deviation.

Tolerance values $T_1$ and $T_2$ and a value for a running variable k are defined at the beginning. In this case, $T_1$ is an absolute tolerance value with the unit in capacitance, and $T_2$ is a relative tolerance value in percent.

A cell from the previously generated network list, a network from said cell and also a k-th cell entity of said cell are subsequently selected.

In a next method step, the differential capacitance value $D_k$ is determined for the k-th cell entity from the difference in the sum of the intrinsic and lateral capacitance values for the selected network and from the sum of the intrinsic and lateral capacitance values of the k-th cell entity.

In the next method step according to the invention, a check is made to determine whether a variant V exists for which the following holds true:

$$|D_k-D_v|\leq T_1 \text{ and } (|D_k-D_v|)/D_v^* \, 100 \leq T_2$$

If this is not the case, in the next step a new variant V having the value $D_v=D_k$ is generated, and in the next step after that the k-th cell entity of the cell is classified into the variant V.

If a variant exists for which the above conditions are met, then in the next step the k-th cell entity of the cell is classified into said variant V.

Afterward, the running variable k is incremented by a predeterminable value, in particular by the value 1.

In the next method step according to the invention, a check is made to determine whether a k-th cell entity exists.

If a k-th cell entity of the cell exists, the method steps are repeated starting from the selection of the k-th cell entity of the cell.

If a k-th cell entity of the cell does not exist, in a next method step a test is effected to determine whether a further network exists in the cell considered.

If this is the case, this network is selected and a value for a running variable k is defined. The method steps are repeated starting from the step of selecting the k-th cell entity of the cell.

By virtue of this embodiment of the invention, cell entities are classified into different variants rapidly and reliably on the basis of their environment-dependent capacitive properties.

Using the tolerance values $T_1$ and $T_2$, which can be individually prescribed by a user, it is possible to set the degree of similarity of the cell entities combined in the same variant V in each case and also the total number of variants in a user-defined manner.

A differential capacitance value $D_k$ is accessed transparently in order to classify the cell entities into the individual variants.

The following method steps according to the invention can advantageously be repeated for further or for all cells of the network list:

definition of up to two tolerance values $T_1$ and $T_2$ and a value for a running variable k, selection of a cell from the network list, selection of a network of the selected cell, selection of the k-th cell entity of the cell, determination of the differential capacitance value $D_k$ for the k-th cell entity from the difference in the sum of the intrinsic and lateral capacitance values for the selected network and from the sum of the intrinsic and lateral capacitance values of the k-th cell entity, testing whether a variant V exists for which $|D_k-D_v|\leq T_1$ and $(|D_k-D_v|)/D_v*100\leq T_2$, if yes: continuation with the step after the next step, formation of a new variant V with $D_v=D_k$, classification of the k-th cell entity of the cell into said variant V, incrementing of k by a predeterminable value, testing whether a k-th cell entity of the cell exists, if yes: continuation with the step of selection of a network of the selected cell, testing whether a further network exists in the cell considered, if yes: selection of this network, definition of a value for the running variable k, continuation with the step of selection of a network of the selected cell.

The execution of the method steps according to the invention results in a complete classification of the network list into variants of environment-dependent cell entities.

In the above-outlined further embodiment of the invention, the following method steps:

testing whether a variant V exists for which $|D_k-D_v|\leq T_1$ and $(|D_k-D_v|)/D_v*100\leq T_2$, if yes: continuation with the step after the next step, formation of a new variant V with $D_v=D_k$, classification of the k-th cell entity of the cell into said variant V, are replaced, starting from the second network considered, with the following steps:

testing whether a variant V exists for which $|D_k-D_v|\leq T_1$ and $(|D_k-D_v|)/D_v*100\leq T_2$ holds true, if not: continuation with the step after the next step, testing whether the k-th cell entity and the cell entities already contained in said variant V have previously been classified in different variants, i.e. before the consideration of this network of the cell, if not: continuation with the step after the next step, formation of a new variant V with $D_v=D_k$, classification of the k-th cell entity of the cell into said variant V.

This ensures that the cell entities are classified into variants particularly reliably and in a manner which also includes the previous results.

With the above and other objects in view there is also provided, in accordance with the invention, a computer program product, comprising a sequence of computer-executable program steps for executing the above-outlined method for simulating an electrical circuit. Similarly, there is also provided, a computer-readable medium, comprising a carrier having computer-executable instructions stored thereon for performing the method for simulating an electrical circuit.

In accordance with an added feature of the invention, the computer-readable medium is a computer storage medium, such as a computer memory, a direct access memory, and/or an electrical carrier signal.

Finally, with the above and other objects in view there is also provided, in accordance with the invention, a simulation method, which comprises downloading a computer program product as outlined above from an electronic data network, such as the Internet, onto a computer connected to the data network, and running the computer program.

That is, the invention is advantageously realized in a computer program for the execution of a method for the simulation of an electrical circuit.

In this case, the computer program is designed in such a way that, after the inputting of a layout of an electrical circuit, a method according to the invention in an embodiment described above can be performed. In this case, as a result of the method, an advantageous simulation of the electrical circuit is possible which accesses variants of cell entities with similar environment-dependent capacitive properties in each case.

A parasitics extraction and a simulation of an electrical circuit can advantageously be performed by means of the method realized on the computer system. The computer program improved according to the invention yields a simple and effective classification of similar cell entities, improved usability of the method for a multiplicity of electrical circuits and a run time improvement compared with the known methods for the simulation of an electrical circuit.

The invention additionally relates to a computer program which is contained on a storage medium, which is stored in a computer memory, which is contained in a direct access memory or which is transmitted on an electrical carrier signal.

Furthermore, the invention relates to a data carrier with such a computer program and also to a method in which such a computer program is downloaded from an electrical data network, such as, for example, from the Internet, onto a computer connected to the data network.

The classification of the variants and the cell entities contained in the respective variants can be output in the form of a "variant classification file". A subsequent simulation of the electrical circuit builds on this "variant classification file". The requisite procedure is known to the person skilled in the art and need not be explained here.

Other features which are considered as characteristic for the invention are set forth in the appended claims.

Although the invention is illustrated and described herein as embodied in a method for the simulation of an electrical circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
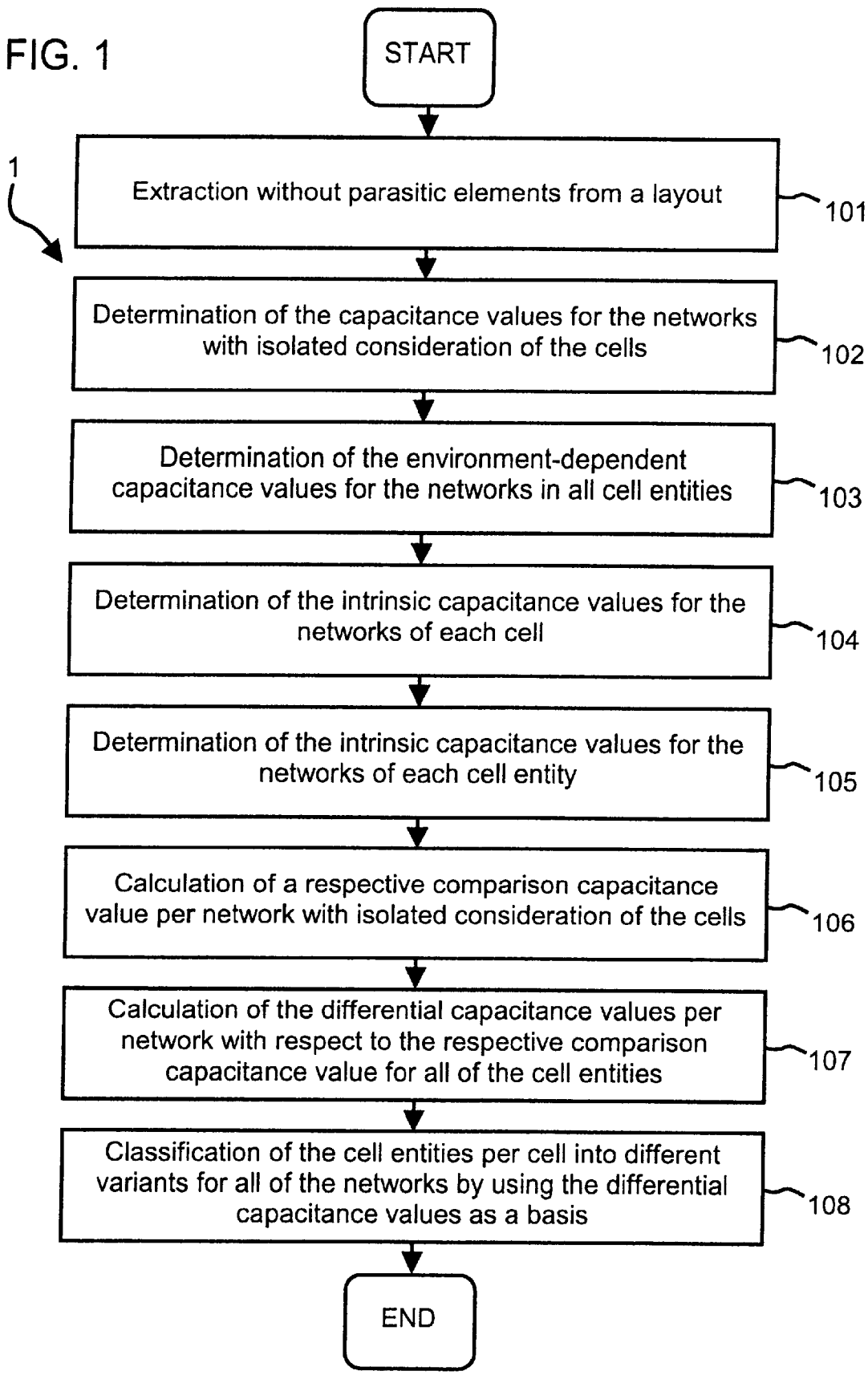
FIG. 1 is a first flow diagram illustrating the method according to the invention for the simulation of an electrical circuit in accordance with an exemplary embodiment.

Referring now to the figures of the drawing in detail and first, particularly, to FIG. 1 thereof, there is shown a first flow diagram 1 of the method according to the invention for the simulation of an electrical circuit in accordance with an exemplary embodiment.

The first flow diagram 1 is subdivided into a start field, into eight method steps 101 to 108 that can be executed successively, and into an end field.

In accordance with a first method step 101, an extraction is performed on a predetermined layout of an electrical circuit considered.

In this case, the extraction provides, in particular, node information for the polygons. The extraction is the method in which the polygons are assigned node information or network names. In this case, an analysis is effected as to which of the polygons are conductively connected to one another after the fabrication process.

The extraction represents a precondition for the generation of a network list. A network list is not necessary at the beginning of the execution of the method according to the invention. Rather, the extracted database is accessed directly, the database containing both the geometry in the form of polygons and the information about the associated networks.

The layout of an electrical circuit contains a geometrical description in the form of polygons or rectangles of all the networks contained on the electrical circuit and/or of all the electrical circuit elements on the electrical circuit. In this case, a set of logically associated geometrical descriptions is combined in a cell. A cell may have, in addition to the geometrical descriptions contained in it, a call-up of one or more other cells at specific coordinates. The insertion of one cell into another cell is also referred to as instantiation. Furthermore, a cell has information about those layers of the electrical circuit on which the networks and/or circuit elements are present.

In a second method step 102, the coupling capacitance values are determined for the networks with isolated consideration of the cells. In this case, the capacitances with respect to adjacent networks are designated as coupling capacitances and the capacitances with respect to ground are designated as intrinsic capacitances.

In a third method step 103, the environment-dependent coupling capacitance values are determined for networks in all of the cell entities. What is used as a basis in this case is the arrangement of the individual cells or cell entities with respect to one another in the layout.

Analytical models which evaluate the geometrical properties of the networks are used to calculate the coupling capacitance values. In each case the arrangement of two or more networks with respect to one another is considered for the purpose of calculating such coupling capacitances. For the calculation of a capacitance value of two networks with respect to one another, use is made of the distance at which the two networks are arranged next to one another and the length over which these two networks run next to one another.

In a fourth method step 104, the intrinsic capacitance values are determined for the networks of each cell.

In a subsequent fifth method step 105, the intrinsic capacitance values are determined for the networks of each cell entity.

The intrinsic capacitance values of the networks result from the form and from the size of the network considered. To that end, the area and also the edge of the network under consideration are calculated using as a basis the geometrical data stored in the layout.

In a subsequent sixth method step 106, in each cell a respective comparison capacitance value per network is calculated, the entity-dependent capacitive network environments not being considered individually. The lateral and intrinsic capacitance values are determined in each case on the lowest network plane or cell plane.

In this case, the comparison capacitance value per network respectively results from the sum of the capacitance values determined in the second method step 102 for the relevant coupling capacitance with isolated consideration of the cells and from the intrinsic capacitance value determined in the fourth method step 104 for the relevant network. In a seventh method step 107, the differential capacitance values with respect to the respective comparison capacitance value are calculated for all of the cell entities and for each network contained in the cell entities. In this case, recourse is had to the environment-dependent capacitance values—calculated in the third method step 103—in all of the cell entities and also to the capacitance values—determined in the fifth method step 105—for the networks of each cell entity.

In a subsequent eighth method step 108, the cell entities per cell are classified into different variants. The differential capacitance values calculated in the seventh method step 107 are used as a basis for this classification of the cell entities into cell variants.

In a method step which is not shown in the first flow diagram 1 in FIG. 1, the behavior of the electrical circuit is simulated using the variants of cell entities which are determined in the eighth method step 108. The flow diagram 1 shown in FIG. 1 is thus concluded.

Figure 2:
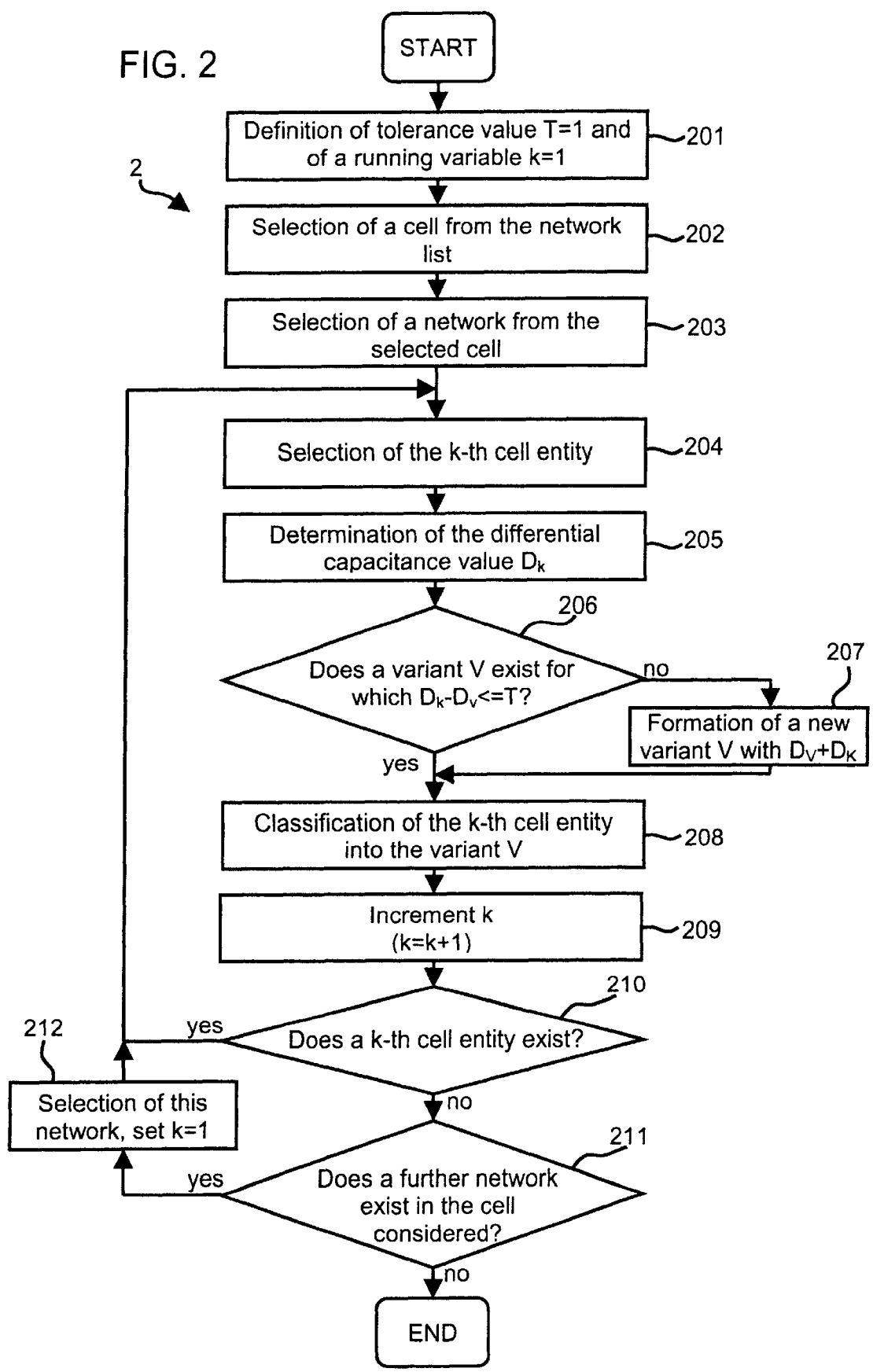
FIG. 2 is a second flow diagram illustrating the method according to the invention for the classification of the cell entities into different variants in accordance with the exemplary embodiment.

FIG. 2 shows a second flow diagram 2 of the method according to the invention for the classification of the cell entities into different variants in accordance with the exemplary embodiment.

The second flow diagram 2 is subdivided into a start field, into method steps 201 to 212 and into an end field. In this case, the flow diagram 2 shown in FIG. 2 illustrates the eighth method step 108 shown in FIG. 1.

In a first method step 201, a tolerance value T=1 is defined and a running variable k is set to the value 1.

In a second method step 202, a cell is selected from the layout, which cell was extracted in the first method step 101 shown in FIG. 1. Afterward, a network is selected from this cell in a third method step 203.

A k-th cell entity of the cell selected in the third method step 203 is selected in a fourth method step 204.

In a fifth method step 205, a differential capacitance value $D_k$ is determined for that k-th cell entity.

A sixth method step 206 is represented in FIG. 2 as a query field, which permits two different continuations. In the sixth method step 206, a check is made to determine whether a variant V already exists for which $|D_k-D_v|\leq T$.

If such a variant V exists, then the k-th cell entity is classified into this variant V in an eighth method step 208. If no such variant V exists, then a new variant V having a value $D_v=D_k$ is formed in a seventh method step 207. The k-th cell entity is then classified into this variant V in the eighth method step 208.

In a ninth method step 209, the running variable k is increased by the value 1. In programming language, then, k=k+1.

A subsequent tenth method step 210 is shown in FIG. 2 as a decision field in the form of a rhombus. In the tenth method step 210, a check is made to determine whether a k-th cell entity exists.

If this is the case, then the method steps according to the invention are repeated beginning with the fourth method step 204.

If a k-th cell entity does not exist, then the method according to the invention is continued with an eleventh method step 211.

The eleventh method step 211 is likewise represented as a decision field in the form of a query in FIG. 2. In the eleventh method step 211, a check is made to determine whether a further network exists in the cell considered.

If this is the case, then a twelfth method step 212 is performed, in which said network is selected and the running variable k is set to the value 1, and the method steps according to the invention are repeated beginning with the fourth method step 204.

If it is ascertained in the eleventh method step 211 that no further network exists in the cell considered, then the method according to the invention is ended according to the second flow diagram 2.

For all further cells of the network list generated in the first method step 101 in accordance with FIG. 1, the method shown using the second flow diagram 2 in FIG. 2 can be repeated starting from the second method step 202.

Figure 3:
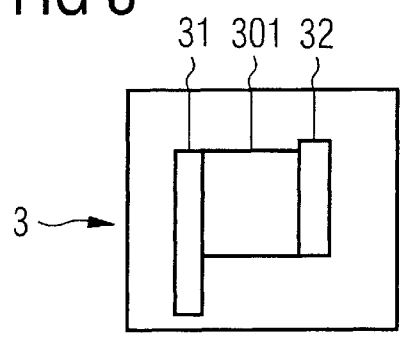
FIG. 3 is a diagrammatic illustration of a plan view of a cell A 3 in accordance with the exemplary embodiment.

Referring now to FIG. 3, there is shown a diagrammatic illustration of a plan view of a cell A 3 in accordance with the exemplary embodiment.

The cell A 3, shown as a square in FIG. 3, has a first network 31, a second network 32 and also a first coupling capacitance 301. In the exemplary embodiment, the coupling capacitances are embodied as lateral capacitances between conductors of the same layer. All lateral capacitances are designated as coupling capacitances in the exemplary embodiment.

The first network 31 and the second network 32 are rectangular. The first network 31 is arranged at the bottom on the left within the cell A 3. The second network 32 is arranged centrally vertically and offset a little toward the right from the center horizontally within the cell A 3. The first network 31 and the second network 32 represent conductors situated on an electrical circuit.

Arranged between the first network 31 and the second network 32 is the first coupling capacitance 301, which terminates with the first network 31 on the left-hand side and with the second network 32 on the right-hand side.

The first coupling capacitance 301 symbolizes a capacitive coupling of the first network 31 and of the second network 32. The first coupling capacitance 301 is accordingly a parasitic capacitance caused by the first network 31 and by the second network 32.

The width of the first coupling capacitance 301 is defined by the horizontal distance between the first network 31 and the second network 32. The bottom side of the first coupling capacitance 301 is situated at the same vertical position as the bottom side of the second network 32. The top side of the first coupling capacitance 301 terminates with the top side of the first network 31.

The first coupling capacitance 301 is not formed as a polygon in the layout. However, the polygon representing the first coupling capacitance 301 in FIG. 3 contains the information about the capacitance value which can be calculated by means of the size and the form, and about those networks between which the capacitance is present as a result of the geometrical contact.

Figure 4:
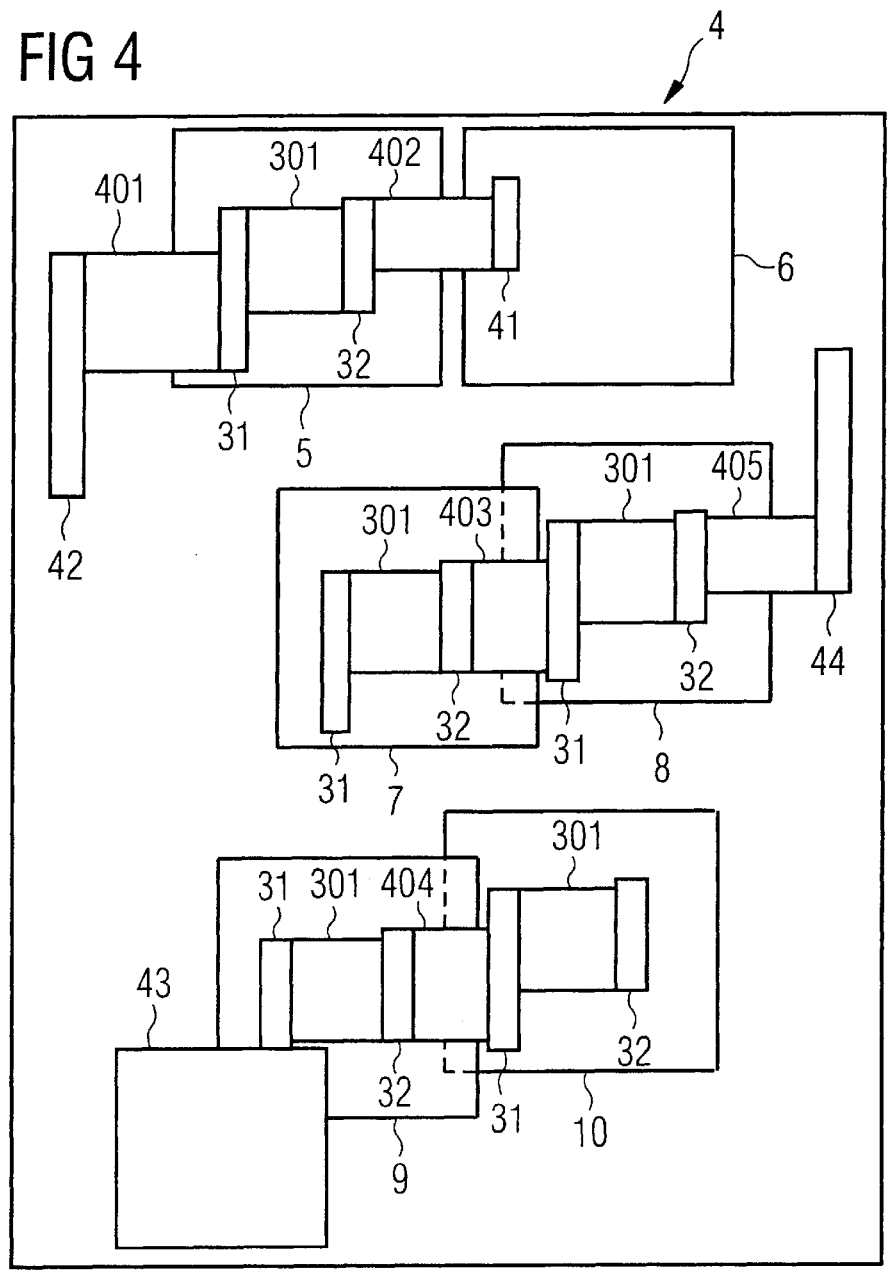
FIG. 4 is a schematic illustration of a plan view of a cell TOP 4 in accordance with the exemplary embodiment.

FIG. 4 shows a diagrammatic illustration of a plan view of a cell TOP 4 in accordance with the exemplary embodiment.

The cell TOP 4 is subdivided into a first entity 5, into a second entity 6, into a third entity 7, into a fourth entity 8, into a fifth entity 9 and into a sixth entity 10. The first entity 5, the third entity 7, the fourth entity 8, the fifth entity 9 and also the sixth entity 10 are in each case cell entities of the cell A 3 which in each case have a first network 31, a second network 32 and also a first intrinsic capacitance 301 of the form and size described with reference to FIG. 3.

The second entity 6 represents a cell entity of a cell B. The second entity 6 corresponds to the cell A 3 in respect of the size and the square basic form. Within the second entity 6, a rectangular third network 41 is arranged in the top left region. Said third network 41 is designed as a conductor.

The cell TOP 4 is rectangular, its height corresponding to 1.5 times its width and the width of the cell TOP 4 being equal to three times the width of the cell A 3.

The first entity 5 and the second entity 6 are arranged next to one another in the upper region of the cell TOP 4, the third entity 7 and the fourth entity 8 are arranged next to one another in an overlapping manner in the central region of the cell TOP 4, and the fifth entity 9 and the sixth entity 10 are arranged next to one another likewise in an overlapping manner in the lower region of the cell TOP 4.

Furthermore, the cell TOP 4 has a fourth network 42 and a fifth network 44, which are each designed as conductors. The fourth network 42 is arranged on the left-side in the upper region of the cell TOP 4 and has a rectangular form. A first lateral capacitance 401, which is represented by a rectangle in FIG. 4, is arranged between the fourth network 42 and the first network 31 of the first entity 5.

A second lateral capacitance 402, which is symbolized by a rectangle in FIG. 4, is produced between the second network 32 of the first entity 5 and the third network 41 of the second entity 6.

The rectangular, fifth network 44 is arranged above the center on the right-side of the cell TOP 4. A fifth lateral capacitance 405 is formed between the second network 32 of the fourth entity 8 and the fifth network 44.

In addition, the cell TOP 4 has a rectangle 43, which represents a so-called "override". The rectangle 43 is a mask in the layout, which is used during the production of the electrical switches and is designed in such a way that the underlying networks do not appear as conductors on the electrical circuit. Consequently, an "override" represents the opposite of a conductor. In the geometrical sense, the rectangle 43 involves the construction "NAND". Such an "override" is not present in the circuit diagram or in the network list. Such an "override" carries no network information and, accordingly, does not represent a network either. Generally, an "override" is understood to be the erasure of networks or network parts on a superordinate hierarchical level.

The rectangle 43 is arranged in the bottom left region within the cell TOP 4 and overlaps the bottom left region of the fifth entity 9. The rectangle 43 erases the covered regions of the geometrically underlying networks. In the exemplary embodiment, this means that a part of the first network 31 in the fifth entity 9 is declared to be invalid and erased. The information about the rectangle 43 is contained in the cell TOP 4. Accordingly, the shortening of the first network 31 of the fifth entity 9 of the cell A 3 is visible only in connection with the cell TOP 4.

A third lateral capacitance 403 is effective between the second network 32 of the third entity 7 and the first network 31 of the fourth entity 8. A fourth lateral capacitance 404 is effective between the second network 32 of the fifth entity 9 and the first network 31 of the sixth entity 10.

The fourth network 42 and the sixth network 44 are conductors provided on the electrical circuit.

The first lateral capacitance 401, the second lateral capacitance 402, the third lateral capacitance 403, the fourth lateral capacitance and the fifth lateral capacitance 405 represent the parasitic capacitances caused by the respectively adjoining conductive networks.

The first coupling capacitance 301 and the lateral capacitances 401 to 405 are not formed as polygons in the layout, but in each case contain information about those networks between which they are present. Their capacitance value can be calculated by means of their size and their form.

All forms and all relative sizes are shown true to scale in the representation of the cell TOP 4 in FIG. 4.

In the exemplary embodiment, the cell TOP 4 is described by an extracted layout, i.e. by a representation in which node information is present and the polygons are therefore assigned to networks.

In the exemplary embodiment, capacitance values are respectively assigned to the first coupling capacitance 301 and to the lateral capacitances 401 to 405. In practice, these capacitance values result for each lateral capacitance in each case from the adjoining two or more networks, the distance and the length over which the two networks run next to one another being taken into account, in particular.

All the numerical values in the exemplary embodiment have the unit fF (i.e., femtofarad=$10^{-15}$ farad). The capacitance values determined in the exemplary embodiment under consideration read as follows:

first coupling capacitance 301: 2 first lateral capacitance 401: 2 second lateral capitance 402: 1.5 third lateral capacitance 403: 2.5 fourth lateral capacitance 404: 2.5 fifth lateral capacitance 405: 2

In a method step according to the invention, the lateral capacitance values are then determined for the networks with isolated consideration of the cells. The bottommost hierarchical level of the cells is considered in each case.

In this case, the cell TOP 4 is arranged one hierarchical level above the cell A 3 and the cell B. The cell A 3 and the cell B are present at the same hierarchical level.

By way of example, only the first intrinsic capacitance 301, but not the first lateral capacitance 401, is considered for the first network 31. This is because the first lateral capacitance 401 is present in the next higher cell level, namely in the cell level of the cell TOP 4. Accordingly, a capacitance value of "2" results for the first network 31. Exclusively the first coupling capacitance 301 is likewise considered for the second network 32. Accordingly, the capacitance value for the second network 32 yields a value "2". The third network 41 has a capacitance value of "0".

The fourth network 42 is present at the cell level of the cell TOP 4. The cell TOP 4 also comprises the first entity 5 of the cell A 3. Accordingly, the first lateral capacitance 401 is added in order to calculate the capacitance value of the fourth network. The capacitance value of the fourth network 42 is "2". The rectangle 43 is not a network. Accordingly, the rectangle 43 does not have a capacitance value. The fifth network 44 is likewise present at the cell level of the cell TOP 4, which comprises the fourth entity 8 of the first cell A 3. Accordingly, the capacitance value of the fifth network 44 is equal to "2". The capacitance values of the individual networks are summarized below for reasons of clarity:

first network 31: 2 second network 32: 2 third network 41: 0 fourth network 42: 2 fifth network 44: 2

In the next method step according to the invention, the environment-dependent coupling capacitance values are determined for the networks in all of the cell entities.

The cross-cell capacitance values are taken into account in each case. The following capacitance values result for the cell entities of the first network 31 of the cell A 3:

first network 31 in the first entity 5: 2
from the first lateral capacitance 401 first network 31 in the third entity 7: 0 first network 31 in the fourth entity 8: 2.5
from the third lateral capacitance 403 first network 31 in the fifth entity 9: 0 first network 31 in the sixth entity 10: 2.5
from the fourth lateral capacitance 404

The following capacitance values result for the cell entities of the second network 32 of the cell A 3:

second network 32 in the first entity 5: 1.5
from the second lateral capacitance 402 second network 32 in the third entity 7: 2.5
from the third lateral capacitance 403 second network 32 in the fourth entity 8: 2
from the fifth lateral capacitance 405 second network 32 in the fifth entity 9: 2.5
from the fourth lateral capacitance 404 second network 32 in the sixth entity 10: 0

For the third network 41, the value 1.5 results in the second entity 6 of the cell B as a result of the second lateral capacitance 402.

In the next step according to the invention, the intrinsic capacitances are determined. This is done in each case at the lowest hierarchical level. It suffices here to proceed cell-specifically in each case for most of the cells. Entity-specific differences result when "overrides" occurs.

The intrinsic capacitances of the networks in the different cells or cell entities in each case result from the geometry, i.e. from the area and from the edge of the network. The intrinsic capacitances determined in a geometry-dependent manner in the exemplary embodiment result as follows:

Cell A 3:
second network 32: 3

Cell B:
third network 41: 2

Cell TOP 4:
first network 31 in the first entity 5: 5
first network 31 in the third entity 7: 5
first network 31 in the fourth entity 8: 5
first network 31 in the fifth entity 9: 3
first network 31 in the sixth entity 10: 5
fourth network 41: 7
fifth network 44: 7

The first network 31 has a shortened form in the fifth entity 9 because of the "override" of the rectangle 43. Accordingly, the coupling capacitance of the first network 31 in the fifth entity 9 is designed to be smaller.

In the next step according to the invention, a comparison capacitance value $D_V$ is calculated for each network. Said value is formed in an entity-independent manner and is calculated from the sum of the lateral and intrinsic capacitance values of said network. By way of example, the comparison capacitance value $D_V$=5 results for the second network 32 from the sum of the capacitance value "2" of the first coupling capacitance 301 and the intrinsic capacitance value "3" of the second network 32. The comparison capacitance values $D_V$ for all the networks are represented below:

first network 31: $D_v$=7
second network 32: $D_v$=5
third network 41: $D_v$=2
fourth network 42: $D_v$=9
sixth network 44: $D_v$=9

In the next step according to the invention, entity-specific differential capacitance values D are determined. In this case, account is taken of the environment-dependent capacitance values and also the deviations—governed by "overrides"—of the intrinsic capacitance values of the networks for each cell entity. Thus, the differential capacitance value D for the first network 31 in the first entity 5 results as the value "+2" from the environment-dependent capacitance value of the lateral first network 31. The differential capacitance value D of the first network 31 in the fifth entity 9 results as "−2" because of the "override" of the rectangle 43. The differential capacitance values D for all the cell entities of the respective networks are listed below:

Cell A:
first network 31 in the first entity 5: D=+2
first network 31 in the third entity 7: D=0
first network 31 in the fourth entity 8: D=+2.5
first network 31 in the fifth entity 9: D=−2
first network 31 in the sixth entity 10: D=2.5
second network 32 in the first entity 5: D=+1.5
second network 32 in the third entity 7: D=+2.5
second network 32 in the fourth entity 8: D=+2
second network 32 in the fifth entity 9: D=+2
second network 32 in the sixth entity 10: D=0

Cell B:
third network 41 in the second entity 6: D=+1.5

Cell TOP 4:
fourth network 42: D=0
fifth network 44: D=0

The capacitance values of the fourth network 42 and of the fifth network 44 are already taken into account in the comparison capacitance value $D_V$.

In the next step according to the invention, cell variants are generated. In this case, the differential capacitance values D are gone through and compared, within relative or absolute tolerances, with the comparison value $D_V$ or newly determined comparison values W of variants V. An absolute tolerance value T=1 is chosen in the exemplary embodiment. Cell entities considered are then classified into a variant if the differential capacitance value D of the cell variant differs by less than |1| from the comparison value of the respective variant.

The five entities of the cell A 3 are considered in the exemplary embodiment.

Firstly, variants are formed and the cell entities of the cell A 3 are classified into these variants for the first network 31.

In a first method step, a variant A is formed for those cell entities which have a differential capacitance value D of zero. This is the first network 31 in the third entity 7 in the exemplary embodiment. The variant A has a comparison value W=0.

Afterward, the first network 31 in the first entity 5 is considered. This first network 31 has a differential capacitance value D=+2 in the first entity 5. Accordingly, the deviation from the value of the variant A is greater than the tolerance value T=1. Accordingly, a new cell variant A_IV1 having a comparison value W=2 is formed. The first entity 5 is classified into this network variant A_IV1.

In the next step, the first network 31 of the fourth entity 8 is considered, which has a differential capacitance value D=+2.5. The deviation of this differential capacitance value D from the comparison value W=0 of the variant A is greater than the tolerance value T=1. Accordingly, the fourth entity 8 is not classified into the variant A. The comparison capacitance value D=2.5 is then compared with the comparison value W=2 of the variant A_IV1. The deviation is "0.5" and lies below the tolerance value T=1. Accordingly, the fourth entity 8 is classified into the variant A_IV1.

The first network 31 has a differential capacitance value D=−2 in the fifth entity 9. This negative differential capacitance value does not lie in any of the tolerance values of the variants A or A_IV1. Accordingly, a new cell variant A_IV2 having the comparison value W=−2 is formed. The fifth entity 9 is classified into this variant A_IV2.

The first network 31 of the sixth entity 10 is thereupon considered, which has a differential capacitance value D=+2.5. This first network 31 of the sixth entity 10 does not lie in the tolerance range of the variant A, but in the tolerance range of the variant A_IV1. Accordingly, the sixth entity 10 is classified into the variant A_IV1.

The classification of the entities of the cell A 3 into the classes formed accordingly results as follows:

Variant A:
  third entity 7
Variant A_IV1:
  first entity 5, fourth entity 8, sixth entity 10
Variant A_IV2:
  fifth entity 9

In the next method steps according to the invention, the second network 32 is considered using its five entities.

Firstly, the second network 32 in the first entity 5 of the cell A 3 is considered, which has the differential capacitance value D=+1.5. The capacitance difference with respect to the comparison capacitance value of the second network 32 is "1.5", and thus greater than the tolerance value T=1. The variants A, A_IV1 and A_IV2 have the cell entities determined for the first network 31. New variants are formed for the cell entities of the second network 32. Accordingly, the first entity 5 is classified into a newly formed variant A_IV3 having a comparison value D=1.5. At the same time, the first entity 5 is removed from the variant A_IV1.

The second network 32 in the third entity 7 is subsequently considered, which has a differential capacitance value D=+2.5. Although the differential capacitance value D fits into the tolerance range of the variant A_IV3, the first entity 5 and the third entity 7 were classified into two different variants in the consideration of the first network 31. The assignment of the first entity 5 and of the third entity 7 to two different variants is maintained. Consequently, a new variant A_IV4 is formed in which the third entity 7 is included. At the same time, the third entity 7 is erased from the variant A. The now empty variant A is rejected.

The second network 32 of the fourth entity 8 is then considered, which has a differential capacitance value D=+2. This differential capacitance value D is contained both in the is tolerance value of the variant A_IV3 and in the tolerance range of the variant A_IV4. In the consideration of the first network 31, the first entity 5 and also the fourth entity 8 were assigned to the same variant A_IV1. Accordingly, the fourth entity 8 is now assigned to the variant A_IV3, which also has the first entity 5. At the same time, the fourth entity 8 is erased from the variant A_IV1.

In the next step, the second network 32 in the fifth entity 9 is considered, which has a differential capacitance value D=+2. If the differential capacitance value D is compared with the comparison values W of the variants A_IV3 and A_IV4, then it is ascertained that the fifth entity 9 could be classified into both variants. However, in the consideration of the first network 31, the fifth entity 9 was classified in each case into different variants than the first entity 5 and the fourth entity 8 and also the third entity 7. This different assignment of these entities is maintained. Accordingly, a new variant A_IV5 is created into which the fifth entity 9 is classified. The now empty variant A_IV2 is rejected.

The second network 32 in the sixth entity 10 is then considered, which has a differential capacitance value D=0. The differential capacitance value D corresponds to the comparison capacitance value $D_v$ of the second network 32. Accordingly, there is no change to the existing classification of the sixth entity 10.

After the processing of the first network 31 and of the second network 32 of the cell A 3, the following classification of classes results:

Cell A:
  Variant A_IV1:
    sixth entity 10
  Variant A_IV3:
    first entity 5, fourth entity 8
  Variant A_IV4:
    third entity 7
  Variant A_IV5:
    fifth entity 9

The five entities of the cell A 3 have been modeled on four variants by the method according to the invention. In the event of a simulation of the cell TOP 4, the variants A_IV1, A_IV3, A_IV4 and A_IV5 are then accessed instead of the five entities of the cell A 3. This produces an improvement in the run time and optimization of the speed of the simulation. The circuit simulation of the resulting hierarchical network list can be effected, for example, by using the software product HSIM available from Nassda Corporation. The requisite procedure is known to the person skilled in the art and need not be explained here.

The terms carrier and storage medium used in the following should be understood to include such computer media as a floppy disk, a hard disk, a CD-ROM, a flash ROM, non-volatile ROM, RAM, transmission signal carrier waves, and so on.

I claim:

1. A method of simulating an electrical circuit that can be described by a layout with a multiplicity of cells having the following features:
   the cells have one or more networks described by geometrical data and subdivided into one or more models of electrical circuit elements;
   the cells have information about those layers on which the networks are present;
   the cells have references to further cells;
   and the method which comprises the following steps:
   a) extracting node information from a layout;
   b) determining and recording coupling capacitance values of the networks with isolated consideration of the cells;
   c) determining and recording environment-dependent coupling capacitance values of the networks for all of the cell entities;
   d) determining and recording intrinsic capacitance values of the networks for each cell;
   e) determining and recording intrinsic capacitance values of the networks for all of the cell entities;
   f) calculating a respective comparison capacitance value for each network with isolated consideration of the cells;
   g) calculating differential capacitance values of each network with respect to a respective comparison capacitance value for all of the cell entities;
   h) classifying the cell entities of each cell into different variants for all of the networks by using the differential capacitance values as a basis; and
   i) simulating a behavior of the electrical circuit using the variants of the cell entities determined in the preceding step.

2. The method according to claim 1, wherein step h) comprises the following substeps:
   h1) defining a tolerance value T and a value for an index k;
   h2) selecting a cell from the layout;
   h3) selecting a network of the cell selected in step h2);
   h4) selecting a k-th cell entity of the cell;
   h5) determining the differential capacitance value $D_k$ for the k-th cell entity from a difference in a sum of the intrinsic and lateral capacitance values for the network selected in step h3) and from a sum of the intrinsic and lateral capacitance values of the network in the k-th cell entity;

h6) testing whether a variant V exists for which $|D_k - D_v| \leq T$, wherein $D_v$ is the comparison capacitance value, and, if the variant V exists, continuing with step h8), otherwise continuing with step h7);

h7) forming a new variant V with $D_v = D_k$;

h8) classifying the k-th cell entity of the cell into the variant V;

h9) incrementing the index k;

h10) testing whether a k-th cell entity of the cell exists and, if a k-th entity exists, continuing with step h4), otherwise:

h11) testing whether a further network exists in the cell under consideration, if the further network exists, selecting the network, defining a value for the index k, and continuing with step h4).

3. The method according to claim 2, which comprises repeating steps h2) to h11) for further cells of the network list.

4. The method according to claim 2, wherein steps h6), h7), and h8) comprise:

starting from a second network under consideration, h6') testing whether a variant V exists for which $|D_k - D_v| \leq T$ and, if the variant does not exist, continuing with step h7');

h6") testing whether the k-th cell entity and the cell entities already contained in the variant V have previously been classified in different variants V and, if not, continuing with step h8');

h7') forming a new variant V with $D_v = D_k$; and h8') classifying the k-th cell entity of the cell into the variant V.

5. The method according to claim 2, which comprises extracting coupling capacitances and intrinsic capacitances in one step as opposed to extracting separately.

6. The method according to claim 2, which comprises extracting only coupling capacitances or only intrinsic capacitances.

7. A computer program product, comprising a sequence of computer-executable program steps for executing the method for simulating an electrical circuit according to claim 1.

8. A simulation method, which comprises downloading a computer program product according to claim 7 from an electronic data network onto a computer connected to the data network, and running the computer program.

9. The simulation method according to claim 8, wherein the electronic data network is the Internet.

10. A computer-readable medium, comprising a carrier having computer-executable instructions stored thereon for performing the method for simulating an electrical circuit according to claim 1.

11. The computer-readable medium according to claim 10, wherein said carrier is selected from the group consisting of a computer storage medium, a computer memory, a direct access memory, and an electrical carrier signal.

* * * * *